United States Patent
Jou et al.

(10) Patent No.: US 9,887,357 B2
(45) Date of Patent: Feb. 6, 2018

(54) METHOD FOR MANUFACTURING AN ORGANIC ELEMENT

(71) Applicant: National Tsing Hua University, Hsinchu (TW)

(72) Inventors: Jwo-Huei Jou, Hsinchu (TW); Tsung-Han Li, Tainan (TW); Saulius Grigalevičius, Kaunas (LT); Gintare Kručaite, Kupiskio District (LT)

(73) Assignee: National Tsing Hua University (TW)

( * ) Notice: Subject to any disclaimer, the term of this patent is extended or adjusted under 35 U.S.C. 154(b) by 0 days.

(21) Appl. No.: 15/408,551

(22) Filed: Jan. 18, 2017

(65) Prior Publication Data

US 2017/0213962 A1 Jul. 27, 2017

(30) Foreign Application Priority Data

Jan. 27, 2016 (TW) .............................. 105102521 A

(51) Int. Cl.
*H01L 51/00* (2006.01)
*C23C 14/26* (2006.01)
*C23C 14/12* (2006.01)
*H01L 51/56* (2006.01)
*H01L 51/50* (2006.01)

(52) U.S. Cl.
CPC ............ *H01L 51/001* (2013.01); *C23C 14/12* (2013.01); *C23C 14/26* (2013.01); *H01L 51/0026* (2013.01); *H01L 51/56* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
None
See application file for complete search history.

(56) References Cited

U.S. PATENT DOCUMENTS

| | | | | |
|---|---|---|---|---|
| 2009/0176036 A1* | 7/2009 | Matsumoto | ............. | C23C 14/12 427/596 |
| 2011/0104398 A1* | 5/2011 | Korevaar | .............. | C23C 14/228 427/561 |
| 2013/0267055 A1* | 10/2013 | Ro | ........................... | C23C 14/04 438/46 |
| 2015/0228910 A1* | 8/2015 | Yamamoto | ........... | C07D 487/04 257/40 |

* cited by examiner

*Primary Examiner* — Asok K Sarkar

(57) ABSTRACT

The primary objective of the present invention is to provide a method for manufacturing organic layers of organic light-emitting device by using deposition machine, which mainly uses the way of premixing organic materials to dissolving and mixing multi kinds of organic materials; moreover, after completing the vacuum drying process to the mixed organic materials, the method is then proceeded for depositing the mixed organic materials on a substrate in single vapor deposition process; after then, the method is proceeded for ended the deposition process to the material carrier and repeatedly operating deposition process to another material container, so as to produce multi-layers structure on the substrate; wherein method proposed by the present invention can replace the conventional manufacturing process and can avoid the disadvantages thereof.

7 Claims, 13 Drawing Sheets

A

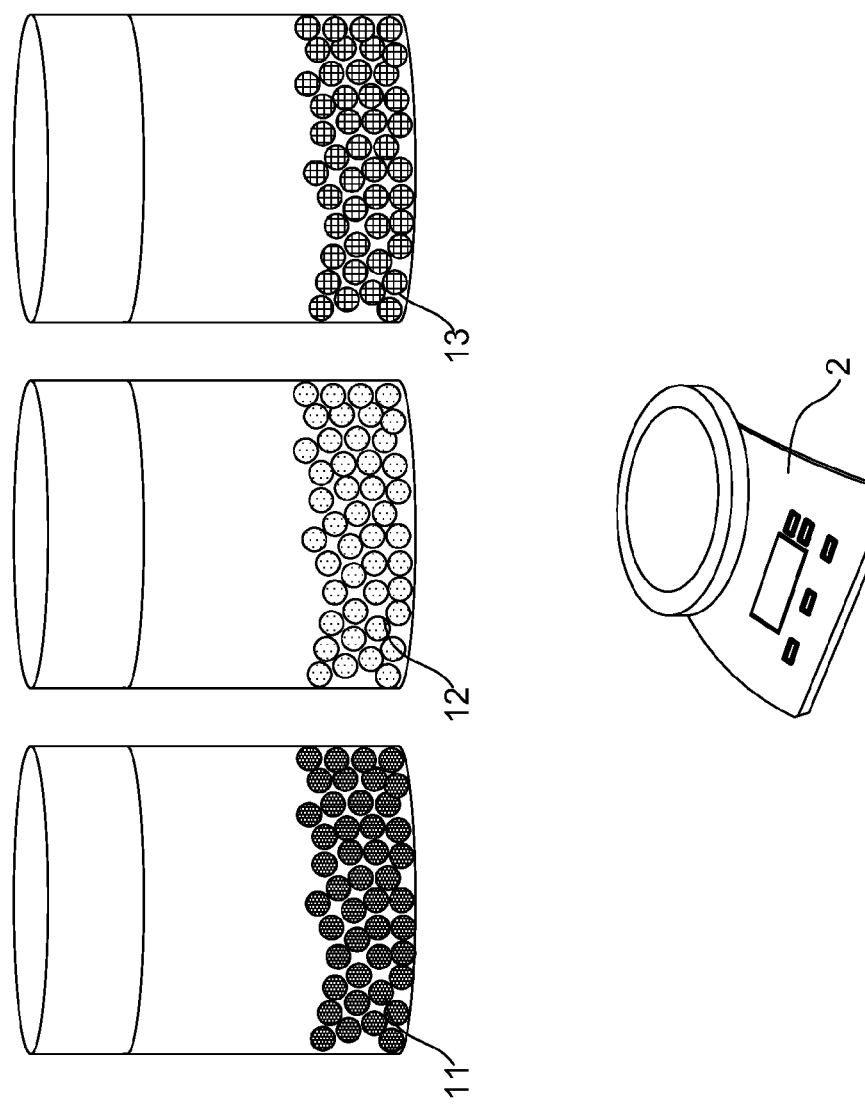

METHOD FOR MANUFACTURING AN ORGANIC ELEMENT

BACKGROUND OF THE INVENTION

1. Technical Field

The present invention relates to the field of manufacturing organic elements, and more particularly, to a method for manufacturing organic layers of organic light-emitting device by using deposition machine.

2. Description of Related Art

Organic Electro-luminescence Display, also called Organic Light Emitting Diode, OLED, was firstly manufactured via vacuum deposition processes by C. W. Tang and S. A. VanSlyk of Kodak company in 1987, wherein hole transport and electron transport materials are respectively coated on a ITO (indium tin oxide) glass, and then an electrode layer is coated on the glass so as to create an OLED device. Further, because the OLED display has high quality characteristics such as high luminance, high reaction speed, more light and less size, full color, no-parallax, and low power consumption, the OLED display has great potential to become a new generation display.

Please refer to FIG. 1, which illustrates a sectional view of a conventional OLED device, as shown in FIG. 1, the structure of a conventional OLED device sequentially consist of a substrate A1, an anode layer A2 (ITO), a hole transporting layer A3 (HTL), an organic emitting layer A4 (EML), an electron transporting layer A5 (ETL), an electron injecting layer A6 (EIL) and a cathode layer A7.

When the OLED device is connect with a forward bias, holes are inserted via the anode layer A2, meanwhile, electrons are inserted via the cathode layer A7, and the holes and the electrons flow between the layers due to the potential difference made by applied electric field, so as to occur recombination in the organic emitting layer A4. Moreover, parts of the energy, which is made by the combination of electrons and holes, emit the luminescent molecules of the organic emitting layer A4 into excited state, and when the luminescent molecules decade from the excited state to ground state, the energy can be released in form of photons, and the process is known as light-emitting organic electroluminescent.

Please refer to FIG. 2, there is shown a schematic diagram of a conventional deposition process for manufacturing OLED device. As shown in FIG. 3, the conventional deposition process includes the following steps: firstly, respectively heating the host material cylinder C, luminescent material cylinder D, and copolymer material cylinder E basis on the deposition ratio thereof for creating pressures in the cylinders above; then make the host material, the luminescent material and the copolymer material in the cylinders deposit on a substrate B by simultaneously controlling the valve nozzles (C1、D1、E1) of the cylinders so as to finish the single layer deposition process for manufacturing OLED device.

Moreover, when the deposition process is applied in real production, the materials are deposited on different substrates through continuously heating the cylinders and controlling the valve nozzles until run out of the materials. However, during the process above, due to the continually losing of the materials in the cylinders, therefore, when the temperature of heating process do not increase will cause the pressure in the cylinders cannot be maintained, and make the deposition ratio going wrong, thus will result in poor yield rate.

Furthermore, the respectively heating process will increase the manufacturing cost, and usually lots of the materials will remain in the cylinders after the manufacturing processes are finished, however, due to the compression ratio of the cylinders are awfully inaccurate, the cylinders need to be replaced before next manufacturing processes begin for keep the compression ratio and the deposition ratio of the materials, in this way, it will not only result in waste of material resources, but will dramatically increase the manufacturing cost for producing OLED device.

Thus, through above descriptions, it can know that the conventional method for manufacturing OLED device still has a lot of disadvantages. For above reasons, the inventor of the present application has made great efforts to make inventive research thereon and eventually provided a method for manufacturing organic layers of organic light-emitting device by using deposition machine.

BRIEF SUMMARY OF THE INVENTION

The primary objective of the present invention is to provide a method for manufacturing organic layers of organic light-emitting device by using deposition machine, which mainly uses the way of premixing organic materials to dissolving and mixing multi kinds of organic materials; moreover, after completing the vacuum drying process to the mixed organic materials, the method is then proceeded for depositing the mixed organic materials on a substrate in single vapor deposition process; after then, the method is proceeded for ended the deposition process to the material carrier and repeatedly operating deposition process to another material container, so as to produce multi-layers structure on the substrate; wherein method proposed by the present invention can replace the conventional manufacturing process and can avoid the disadvantages thereof.

capable of being manufactured by way of anodic treatment and die casting technology with low cost and rapid production, therefore this scintillator with sub-micron column structure includes the advantages of low manufacture-processing time, low cost and simple manufacturing process.

Accordingly, to achieve the primary objective of the present invention, the inventor proposes a scintillator with sub-micron column structure, comprising: a tubular template, having a plurality of thin film oxidized metal tubes; a plurality of scintillators, filled in the thin film oxidized metal tubes; and a package layer, formed on the surface of the tubular template for protecting the scintillators from being damaged by water vapor and oxygen. Moreover, the aforesaid scintillator with sub-micron column structure further comprises a reflective layer formed on the inner walls of the thin film oxidized metal tubes.

The another objective of the present invention is to provide a method for manufacturing an organic element, through the manufacturing method, the scintillator with sub-micron column structure can be made by anodic treatment and die casting technology with low cost and rapid production; moreover, the film oxidized metal tubes of the tubular template can be further manufactured to nano tubes by adjusting electrolyte composition, electrolysis voltage, and processing time of anodic treatment, and the aperture size, the thickness and the vessel density of the nano tube can be controlled and ranged from 10 nm to 500 nm, 0.1 μm to 1000 μm, and $10^8$ to $10^{12}$ tube/cm$^2$, respectively.

So that, for achieving the another objective of the present invention, the inventor proposes a method for manufacturing an organic element, comprising the steps of:

(1) respectively weighing and distributing at least one organic material;
(2) dissolving the organic material via an organic solvent and producing at least one organic material solution;
(3) evenly mixing the organic material solution according to a mixing ratio and producing a liquid mixture;
(4) disposing the liquid mixture into a first material container so as to operate a vacuum drying process and producing a first solid mixture;
(5) operating a vapor deposition process with the first solid mixture and producing a first organic layer; and
(6) ending the vapor deposition process to the first solid mixture and the first material container.

Moreover, for repeatedly producing multi-layers structures on the substrate, the method of the present invention further comprises the following steps after the step (6) is completed:

(7) judging if a second organic layer needed to be produced; if yes, runs to next step; if no, terminates the process;
(8) respectively weighing and distributing needed at least one organic material;
(9) dissolving the organic material of step (8) via an organic solvent and producing at least one organic material solution;
(10) evenly mixing the organic material solution of step (9) according to a mixing ratio and producing a second liquid mixture;
(11) disposing the second liquid mixture into a second material container so as to operate the vacuum drying process and producing a second solid mixture;
(12) operating the vapor deposition process with the second solid mixture and producing the second organic layer;
(13) ending the vapor deposition process to the second solid mixture and the second material container; and
(14) judging if a N organic layer needed to be produced; if yes, repeats step (8) to step (13); if no, terminates the process.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein:

FIG. 4a to FIG. 4e are illustrated diagrams of the method for manufacturing an organic element;

DETAILED DESCRIPTION OF THE INVENTION

Figure 1:
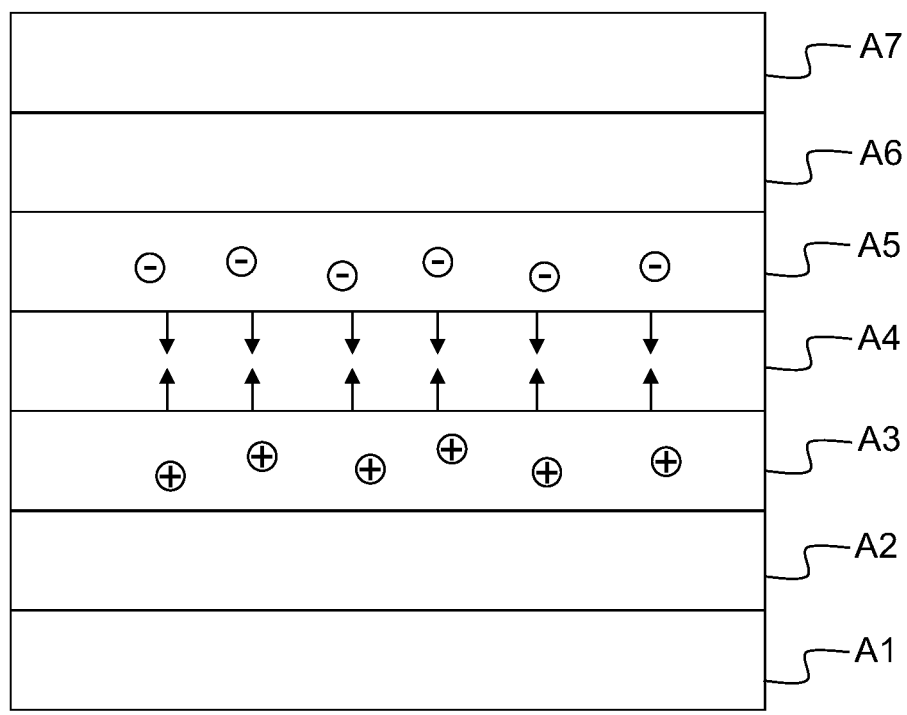
FIG. 1 is a sectional view of a conventional OLED device.
Figure 2:
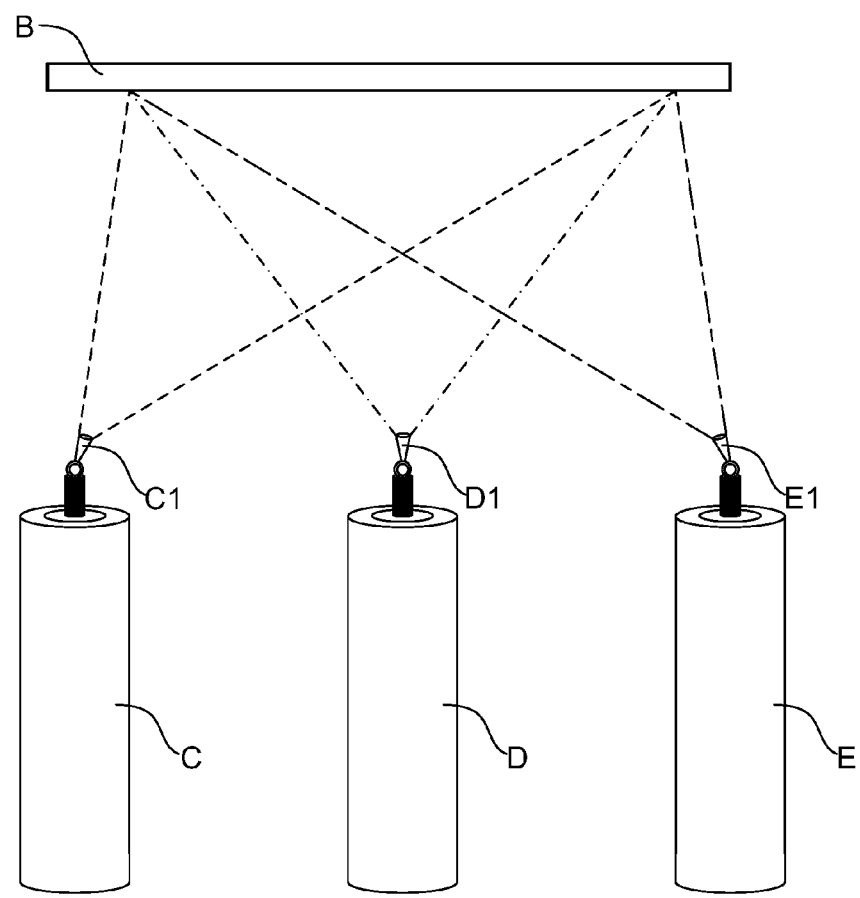
FIG. 2 is a schematic diagram of a conventional deposition process for manufacturing OLED device.
Figure 3:
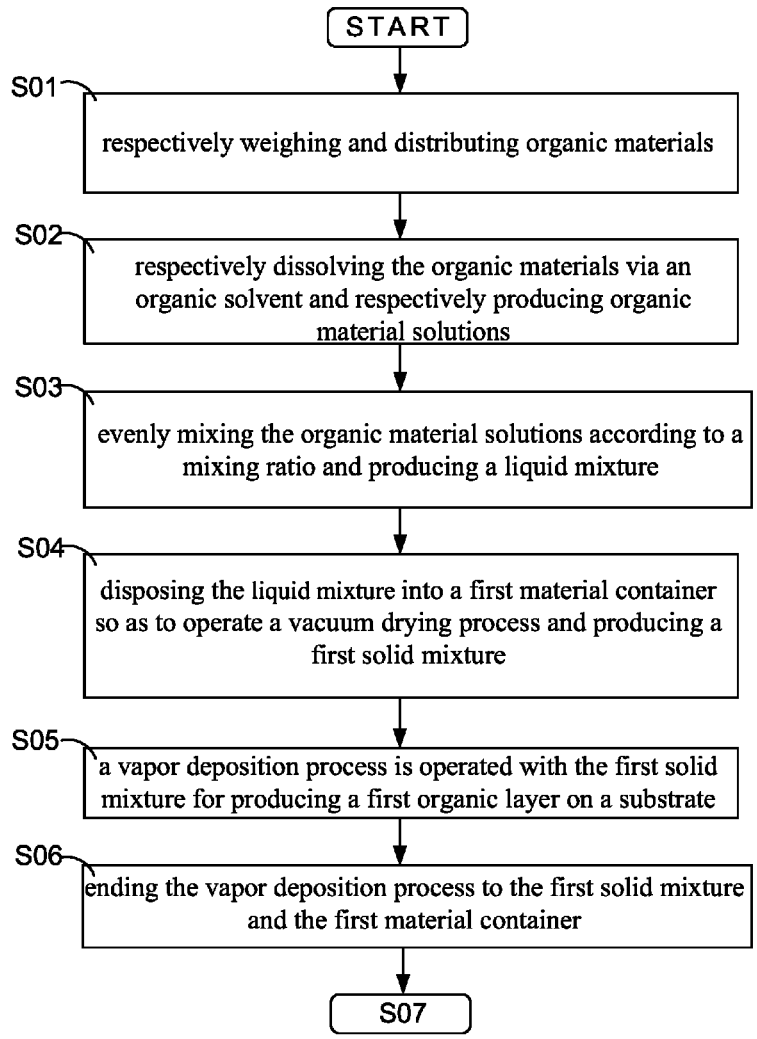
FIG. 3 is a flowchart of the method for manufacturing an organic element according to the present invention.
Figure 4B:
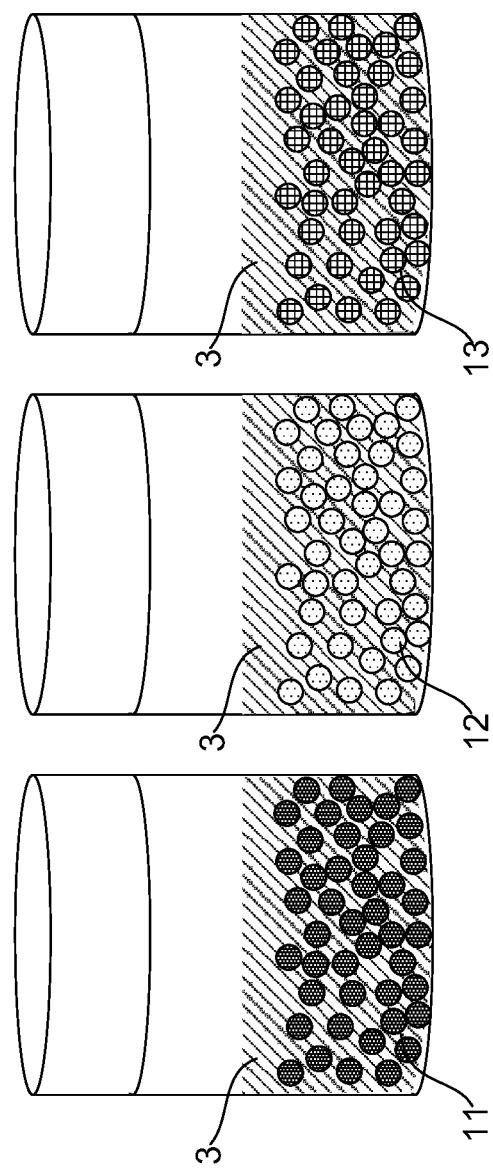
Figure 4D:
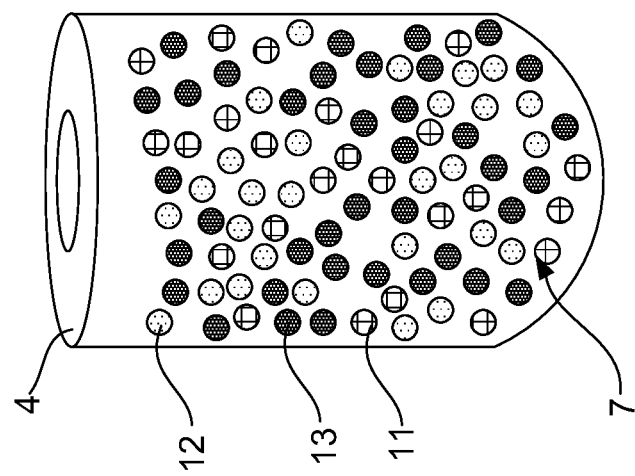
Figure 4C:
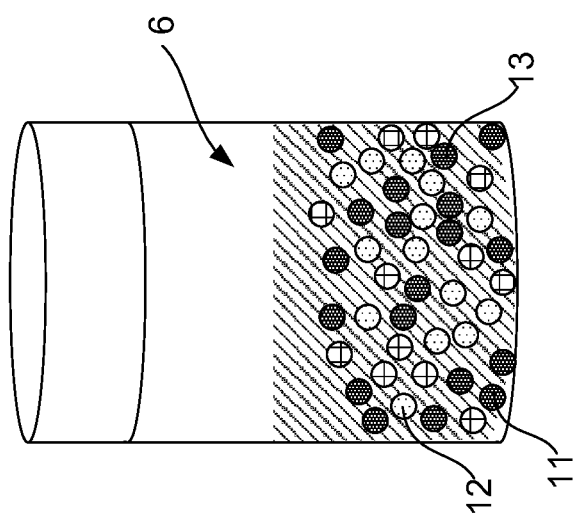
Figure 4E:
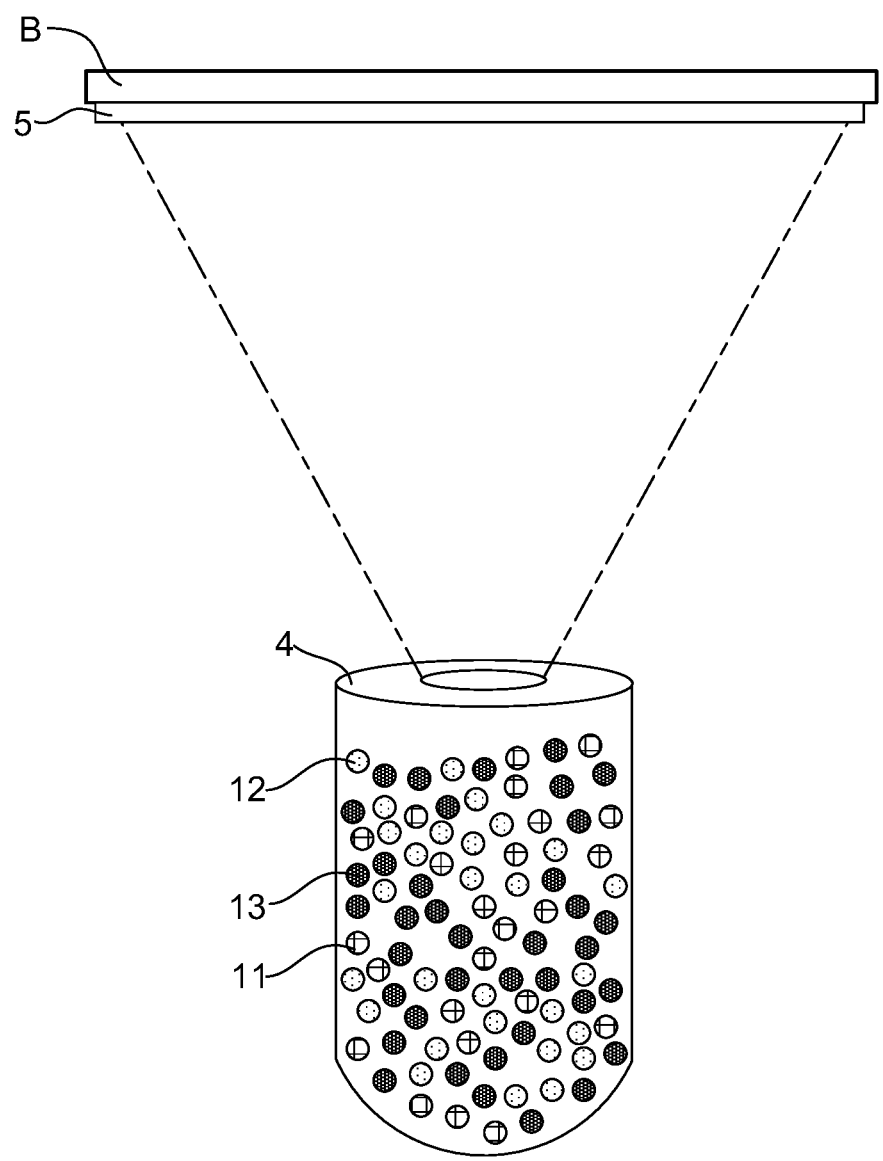
Figure 5:
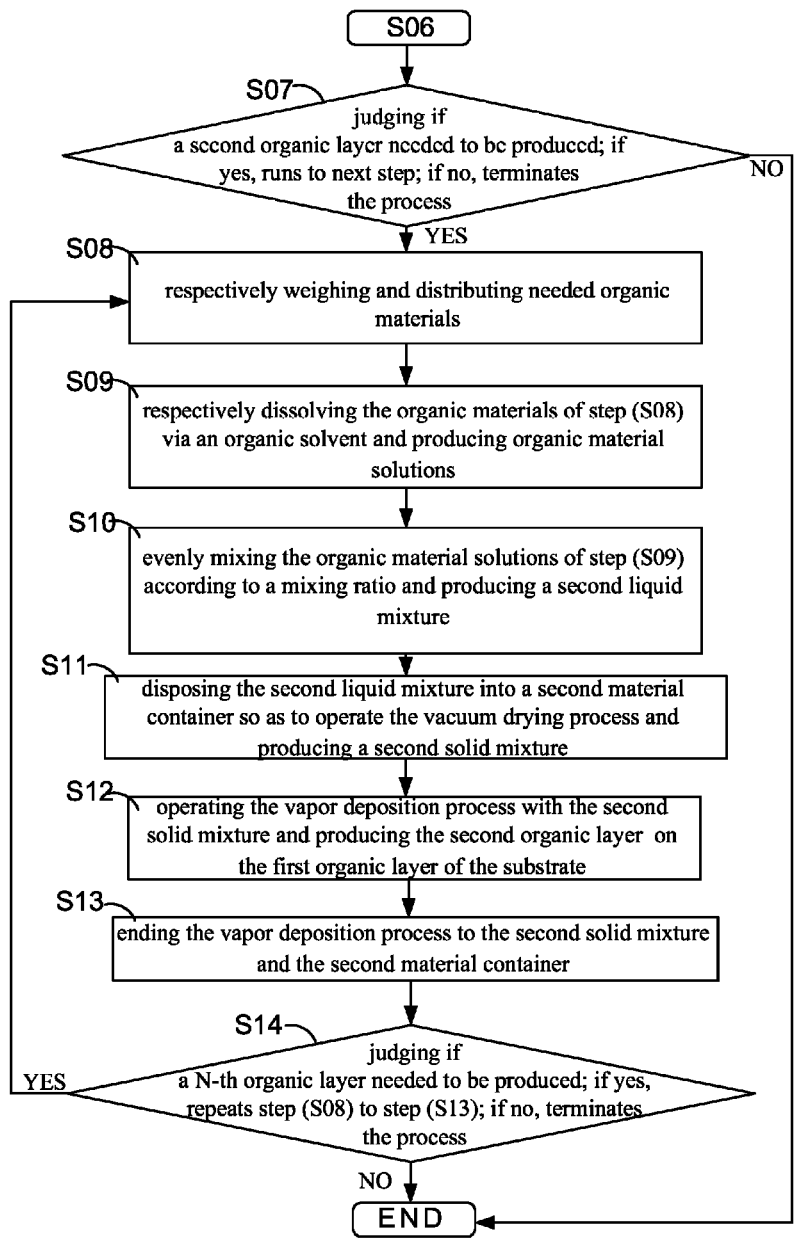
FIG. 5 is a second flowchart of the method for manufacturing an organic element.
Figure 6B:
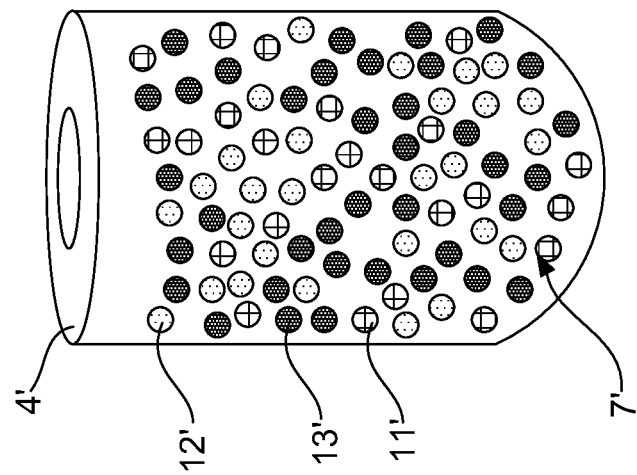
FIG. 6a to FIG. 6c are second illustrated diagrams of the method for manufacturing an organic element.
Figure 6A:
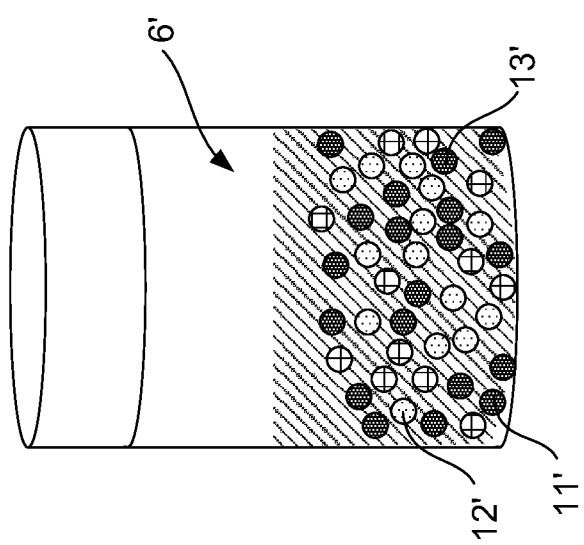
Figure 6C:
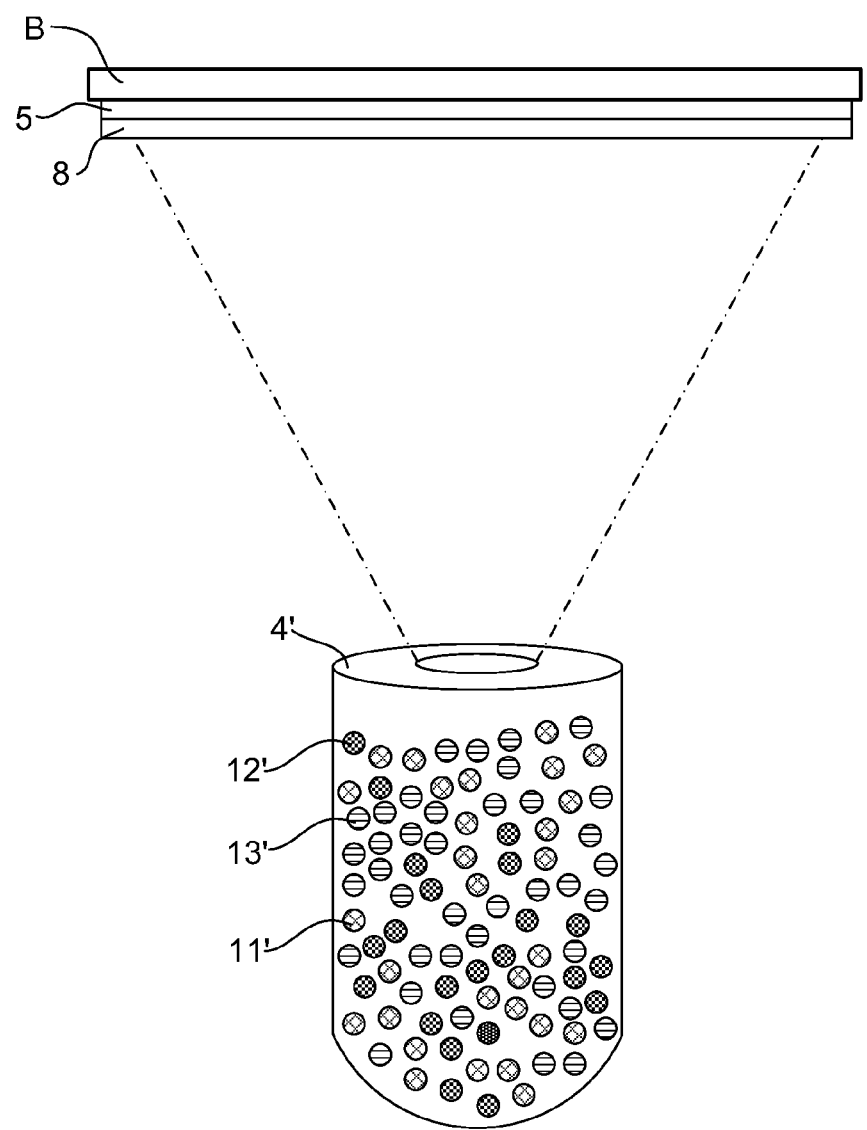

To more clearly describe a method for manufacturing organic layers of organic light-emitting device by using deposition machine according to the present invention, embodiments of the present invention will be described in detail with reference to the attached drawings hereinafter.

Please refer to FIG. 3 and FIG. 4a to FIG. 4e, there is shown a flowchart and illustrated diagrams of the method for manufacturing organic layers of an organic light-emitting device by using a deposition machine according to the present invention. As shown in FIG. 3 and FIG. 4a to FIG. 4e this manufacturing method includes 6 primary following steps.

The method is firstly proceeds to step (S01) for respectively weighing and distributing organic materials (11、12、13). Next, the method proceeds to step (S02) for respectively dissolving the organic materials (11、12、13) via an organic solvent 3 and respectively producing organic material solutions. Continuously, the method proceeds to step (S03) for evenly mixing the organic material solutions according to a mixing ratio and producing a liquid mixture 6.

After completing the step (S03), step (S04) of the method is then proceeded for disposing the liquid mixture 6 into a first material container 4 so as to operate a vacuum drying process and producing a first solid mixture 7. Next, in step (S05), a vapor deposition process is operated with the first solid mixture 7 for producing a first organic layer 5 on a substrate B. And then the method proceeds to step (S06) for ending the vapor deposition process to the first solid mixture 7 and the first material container 4.

In addition, the first material container 4 and the vapor deposition process of the present invention have single-use characteristic, which means the first solid mixture 7 in the first material container 4 will completely run out during a single vapor deposition process is operated. After complete producing the first organic layer 5 on the substrate B, the method continuously proceeds to following steps for producing second organic layer.

Please refer to FIG. 5 and FIG. 6a to FIG. 6c, there is shown the second flowchart and the second illustrated diagrams of the method for manufacturing an organic element according to the present invention. As shown in the FIGs, after the step (S06) is completed, step (S07) of the method is then proceeded for judging if a second organic layer 8 needed to be produced; if yes, runs to next step; if no, terminates the process. In step (S08), the method is then proceeded for respectively weighing and distributing needed organic materials (11', 12', 13').

Next, the method proceeds to step (S09) and step (S10) for respectively dissolving the organic materials (11', 12', 13') of step (S08) via an organic solvent and producing organic material solutions, and then evenly mixing the organic material solutions of step (S09) according to a mixing ratio and producing a second liquid mixture 6'.

After completing the step (S10), step (S11) of the method is then proceeded for disposing the second liquid mixture 6' into a second material container 4' so as to operate the vacuum drying process and producing a second solid mixture 7'. Continuously, the method proceeds to step (S12) for operating the vapor deposition process with the second solid mixture 7' and producing the second organic layer 8 on the first organic layer 5 of the substrate B. And then the method proceeds to step (S13) for ending the vapor deposition process to the second solid mixture 7' and the second material container 4'.

In the present invention, after completing the step (S13), step (S14) of the method is then proceeded for judging if a N-th organic layer needed to be produced; if yes, repeats step (S08) to step (S13); if no, terminates the process. Thus, according to the method provided in the present invention, each of the multi-layer structures of an OLED element can be sequentially produced so as to complete OLED device manufacturing process.

Moreover, the step (S05) operates disposable evaporation, means the first solid mixture in the first material container only evaporation one time then the process runs to step (S06), moreover, the step (S12) also operates disposable evaporation and the second solid mixture in the second material container only evaporation one time then the process runs to step (S13). Furthermore, the vapor deposition process of step (S05) and step (S12) are completed via evaporation method or vacuum deposition method.

Besides, the organic solvent of the step (S02) and step (S09) is selected from the group comprising: toluene, acetone, and tetrahydrofuran (THF); and the organic material of the step (S01) and step (S08) are luminescent materials selected from the group comprising: fluorescent material, phosphorescent material, and mixtures thereof.

In addition, the organic material of the step (S01) and the step (S08) also can be host materials, and the host materials are selected from the group comprising: $Alq_3$, DPVBi, BANE, Rubrene, CBP, and mixtures thereof. Meanwhile, the organic material of the step (S01) and the step (S08) also can be used for producing layers comprising: electron transporting layer, electron injecting layer, hole transporting layer, hole injecting layer, and hole blocking layer.

Figure 7A:
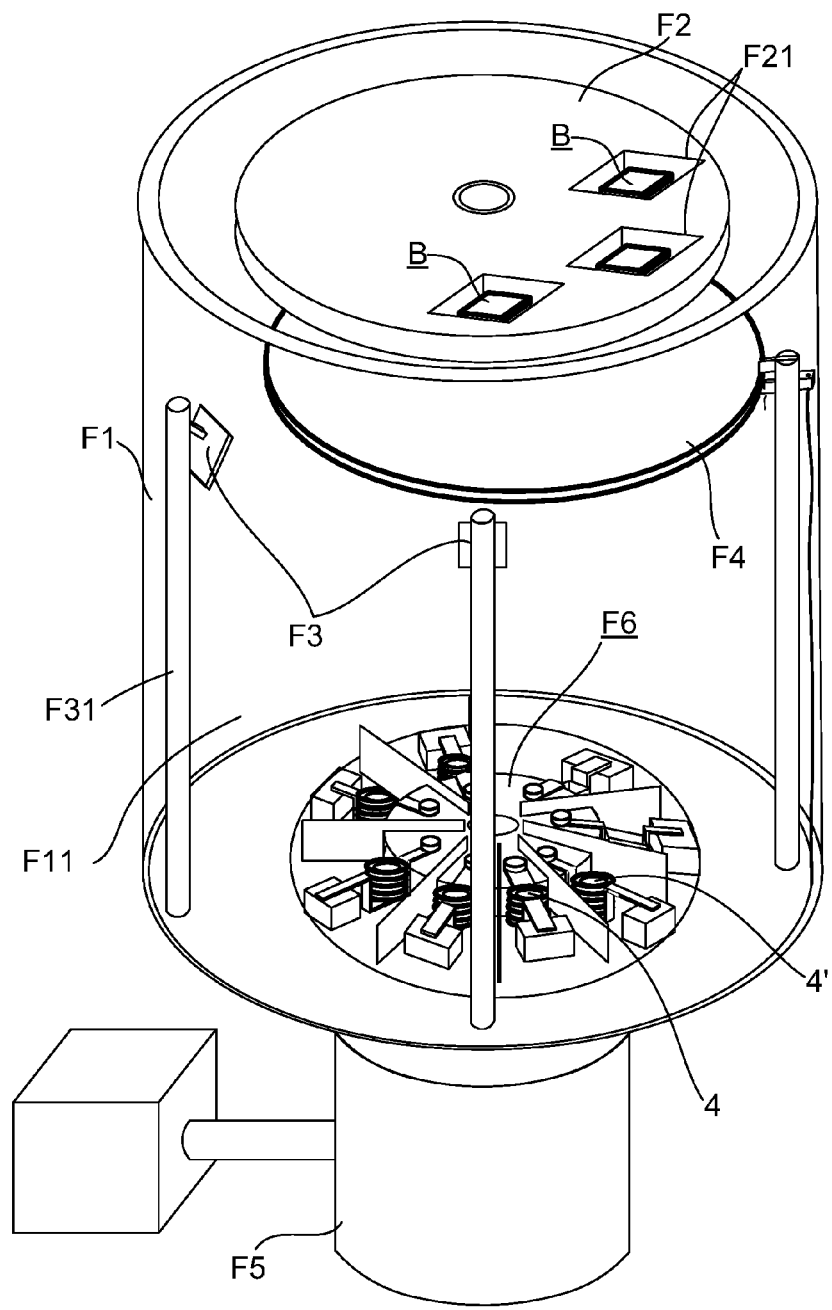
FIG. 7a to FIG. 7b are illustrated diagrams of the deposition machine for manufacturing organic elements according to the present invention.
Figure 7B:
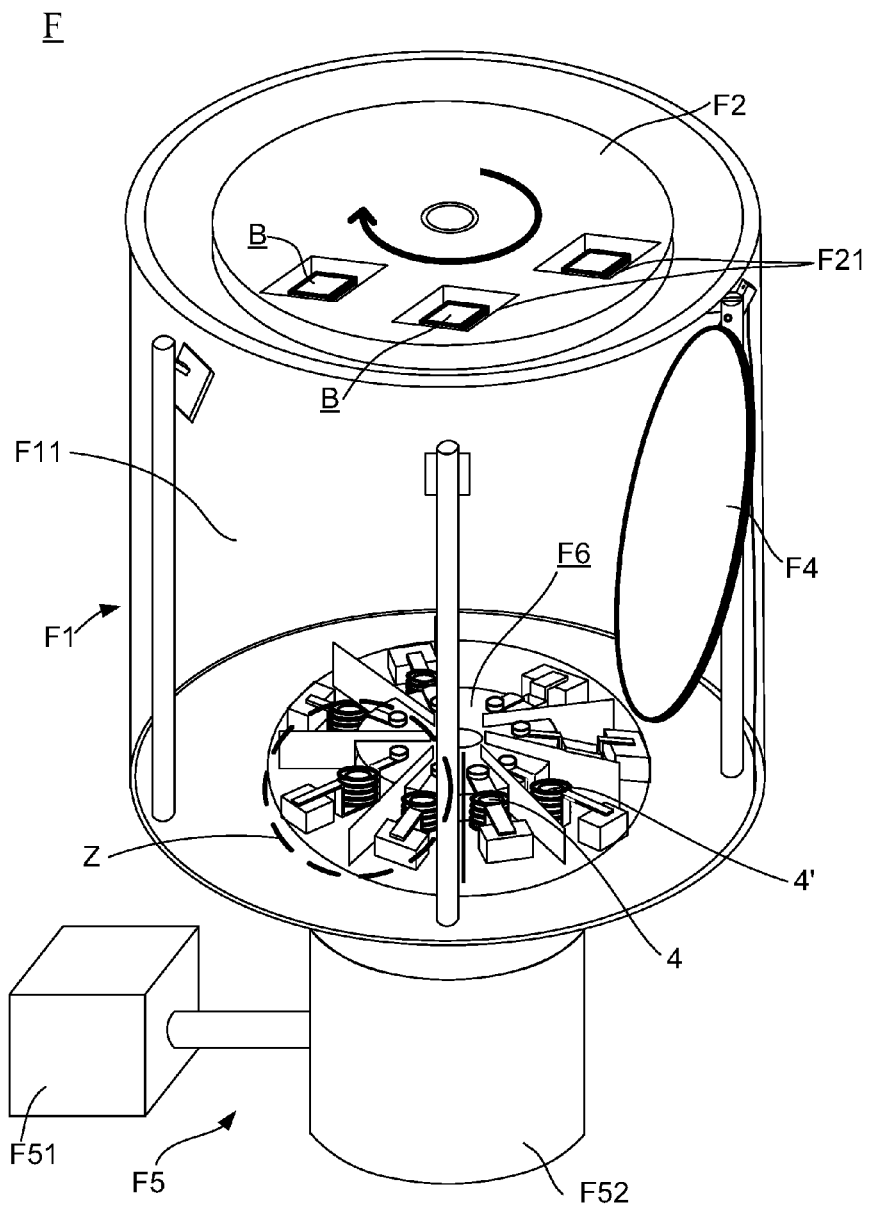

Refer to FIG. 7a to FIG. 7b, there are shown illustrated diagrams of the deposition machine for manufacturing organic elements according to the present invention. As shown in FIG. 7a to FIG. 7b, the steps (S04) to (S06) and the steps (S11) to (S13) are operated through a deposition machine F in the present invention, and the said deposition machine F is able to control the deposition orders, moreover, the first material container 4 and the second material container 4' sequentially operate deposition process via the deposition machine. Furthermore, the substrate B is disposed on the deposition machine F and multi organic layers are sequentially deposited on the substrate B via the method above, and the substrate B can be a hard substrate or a flexible substrate.

In more detail, the deposition machine F majorly comprises: a main body F1, a heating plate F6, a vacuum module F5, and a substrate carrier F2; wherein the main body F1 comprises a depositing space F11, and the heating plate F6 is disposed on the bottom of the depositing space F11 and comprises a plurality of heating electrodes. Moreover, the vacuum module F5 is connected with the main body F1 for making the depositing space F11 be vacuumed.

In addition, the substrate carrier F2 is disposed on the top of the depositing space F11 and opposite to the heating plate F6, wherein the substrate B is disposed on the substrate carrier F2 and faces to one of the heating electrodes. Moreover, the first material container 4 is disposed on the said heating electrode in the step (S05), so as to deposit the first solid mixture and produce the first organic layer on the substrate B of the substrate carrier F2 via heating the first material container.

Inheriting to above description, the substrate carrier F2 rotates during the vapor deposition process operated, so as to make the first solid mixture evenly deposited on the substrate B. Moreover, the vapor deposition process in the step (S06) is ended by turning off the heating electrode which the first material container 4 is disposed on.

On the other hand, the second material container 4' is disposed on another heating electrode in the step (S12), so as to deposit the second solid mixture and evenly produce the second organic layer on the substrate B of the substrate carrier F2 via heating the second material container and rotating the substrate carrier F2 simultaneously. Moreover, the vapor deposition process in the step (S13) is ended by turning off the heating electrode which the second material container 4' is disposed on.

Referring to FIG. 7a to FIG. 7b, the vacuum module F5 comprises a mechanical pump F51 and a diffusion pump F52 for making the depositing space F11 be vacuumed. And the substrate carrier F2 is a turntable formed with a plurality of substrate receiving openings for receiving the substrates B. Moreover, a blocking plate (not shown) is disposed on the bottom of each the substrate receiving opening, and the blocking plate blocks between the substrate B and the heating plate F6.

According to the substrate receiving openings, plurality of substrates can be disposed on the substrate carrier F2 in the same time for alternately operating deposition process; moreover, user can specify any substrate B for operating the deposition process through the blocking plate.

Besides, the deposition machine F further comprises a controlling baffle F4 and a film thickness sensor F3, the blocking plate F4 is disposed in the depositing space F11, wherein the blocking plate F4 can block between the substrate carrier F2 and the heating plate F6; on the other hand, the film thickness sensor F3 is disposed in the depositing space F11 and fixed at a certain height through a supporting column F31.

Thus, users can real-time monitor the thickness of the organic layers on the substrate B by the film thickness sensor F3, and modify the thickness through operating the blocking plate F4 blocked between the substrate carrier F2 and the heating plate F6.

Figure 8:
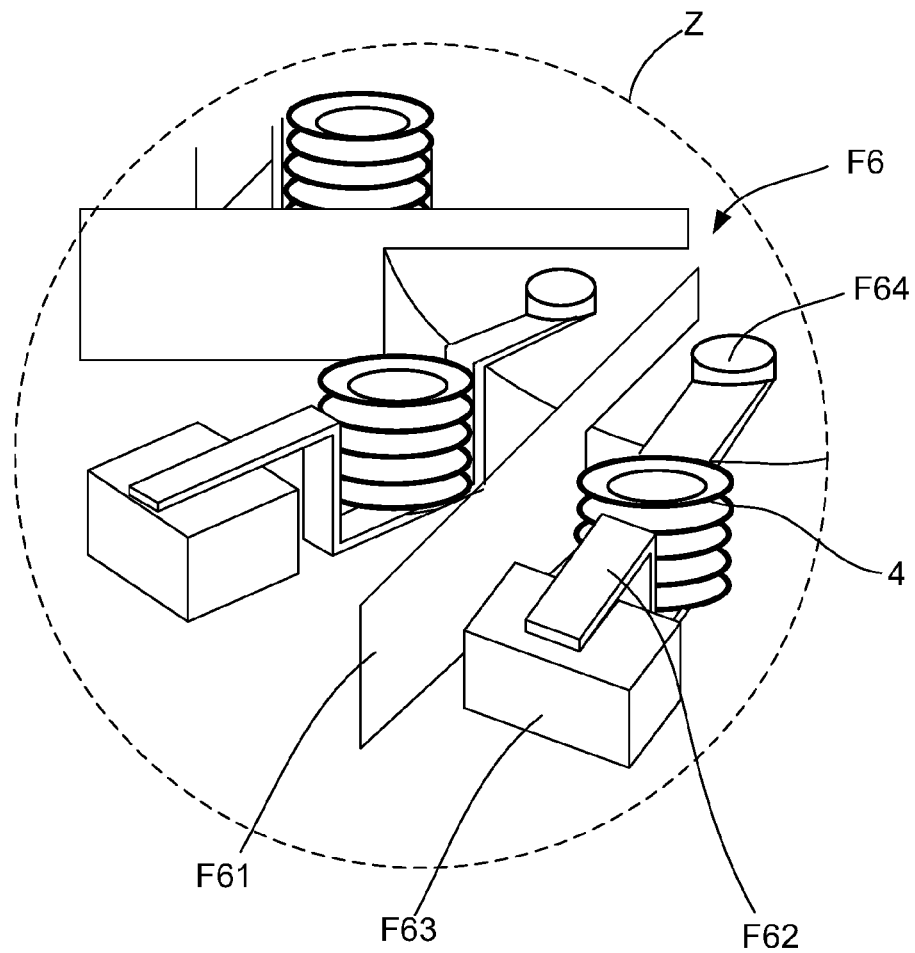
FIG. 8 is an enlarged view of Z zone in the FIG. 7b.

Please refer to FIG. 7a to FIG. 7b again, and please simultaneously refer to FIG. 8, which shows enlarged view of Z zone in the FIG. 7b, as shown in the FIGs, each of the heating electrodes comprises: a first electrode connecting member F63, a second electrode connecting member F64 and a container receiving member F62, wherein the material container is disposed on the container receiving member F62, moreover, the both ends of the container receiving member F62 are respectively connected with the first electrode connecting member F63 and the second electrode connecting member F64.

Besides, the heating electrodes are disposed on the heating plate F6 in surrounding way, and an isolation plate F61 is disposed between two adjacent heating electrodes, wherein the contaminating between solid mixtures of material container through the heating plate F6.

Therefore, the above descriptions have been clearly and completely introduced the method for manufacturing an organic element and the deposition machine for operating thereof of the present invention; in summary, the present invention has the following advantages:

1. According to the method of the present invention, the high manufacturing cost cause by respectively heating process and depositing different materials on a substrate simultaneously can be avoid.

2. By using the deposition machine and the single-use characteristic of the vapor deposition process, the method proposed by the present invention can replace the conventional manufacturing process, so as to avoid the disadvantages of heating and maintaining the pressure in cylinders, and increase the yield rate of OLED devices.

The above description is made on embodiments of the present invention. However, the embodiments are not intended to limit scope of the present invention, and all equivalent implementations or alterations within the spirit of the present invention still fall within the scope of the present invention.

We claim:

1. A method for manufacturing organic layers of an organic light-emitting device by using a deposition machine (F), wherein the deposition machine (F) comprises:
    a main body (F1), having a depositing space (F11);
    a heating plate (F6), being disposed in the depositing space (F11) and comprising a plurality of heating electrodes, wherein each of the heating electrodes have a container receiving member (F62);
    a plurality of isolation plates (F61), wherein any one of the isolation plates (F61) is disposed between two adjacent heating electrodes;
    a vacuum module (F5), being connected to the main body (F1), and used for making the depositing space (F11) become a vacuum space;
    a substrate carrier (F2), being disposed in the depositing space (F11) and positioned over the heating plate (F6), used for carrying at least one substrate;
    a film thickness sensor (F3), being disposed in the depositing space (F11); and
    a blocking plate (F4), being disposed in the depositing space (F11);
    wherein the method comprising steps of:
    (1) preparing a plurality of organic materials;
    (2) dissolving the organic materials by at least one organic solvent so as to obtain a plurality of organic material solutions;
    (3) evenly mixing the organic material solutions based on a mixing ratio and then obtaining a first liquid mixture;
    (4) disposing the first liquid mixture into a first material container and subsequently applying a vacuum drying process to the first material container for converting the first liquid mixture to a first solid mixture, and then disposing the first material container onto a first heating electrode of the plurality of heating electrodes;
    (5) raising a first isolation plate of the plurality of isolation plates (F61);
    (6) enabling the first heating electrode to heat the first material container, so as to carry out a vapor deposition process and then form a first organic layer on the substrate;
    (7) using the film thickness sensor (F3) to measure the thickness of the first organic layer;
    (8) enabling the block plate (F4) to shield the substrate after the thickness of the first organic layer reaches a wanted thickness, such that the first solid mixture is avoided from being continuously deposited onto the substrate; and
    (9) disabling the first heating electrode, and then a one-time organic layer depositing process of the organic light-emitting device is finished.

2. The method of claim 1, further comprising following steps:
    (9) determining whether a second organic layer is needed to be deposited onto the first organic layer; if yes, proceeding to step (10); otherwise, ending the steps;
    (10) repeating the steps (1)-(3) for obtaining a second liquid mixture;
    (11) disposing the second liquid mixture into a second material container and subsequently applying a vacuum drying process to the second material container for converting the second liquid mixture to a second solid mixture, and then disposing the second material container onto a second heating electrode of the plurality of eating electrodes;
    (12) raising a second isolation plate of the plurality of isolation plates (F61), and then enabling the second heating electrode to heat the second material container, so as to produce a second organic layer on the first organic layer;
    (13) using the film thickness sensor (F3) to measure the thickness of the second organic layer;
    (14) enabling the block plate (F4) to shield the substrate after the thickness of the second organic layer reaches a wanted thickness, such that the second solid mixture is avoided from being continuously deposited onto the first organic layer; and
    (15) disabling the second heating electrode, and then a one-time organic layer depositing process of the organic light-emitting device is finished.

3. The method of claim 2, wherein the organic solvent is selected from the group consisting of toluene, acetone, and tetrahydrofuran (THF).

4. The method of claim 2, wherein the organic materials are luminescent materials, and the luminescent material is selected from the group consisting of fluorescent material, phosphorescent material, and mixtures of aforesaid two materials.

5. The method of claim 2, wherein the organic materials are host materials, and the host material is selected from the group consisting of Alq3, DPVBi, BANE, Rubrene, CBP, and mixture of aforesaid two or more materials.

6. The method of claim 2, wherein the organic materials are carrier layers, and the carrier layer is selected from the group consisting of electron transporting layer, electron injecting layer, hole transporting layer, hole injecting layer, and hole blocking layer.

7. The method of claim 2, further comprising following step:
    (16) determining whether an N-th organic layer of the organic light-emitting device is needed to be produced; if yes, repeating the steps (9)-(15); otherwise, ending the steps.

* * * * *